United States Patent

(12) United States Patent
Ahn et al.

(10) Patent No.: US 8,518,794 B2
(45) Date of Patent: Aug. 27, 2013

(54) SEMICONDUCTOR DEVICES AND METHODS OF FORMING THEREOF

(75) Inventors: Hokyun Ahn, Daejeon (KR); Jong-Won Lim, Daejeon (KR); Hyung Sup Yoon, Daejeon (KR); Woojin Chang, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 146 days.

(21) Appl. No.: 12/874,102

(22) Filed: Sep. 1, 2010

(65) Prior Publication Data

US 2011/0057237 A1    Mar. 10, 2011

(30) Foreign Application Priority Data

Sep. 4, 2009    (KR) .................... 10-2009-0083600

(51) Int. Cl.
*H01L 29/78*    (2006.01)
*H01L 21/336*    (2006.01)

(52) U.S. Cl.
USPC ........... 438/422; 438/182; 438/421; 257/250; 257/330; 257/E21.581; 257/E21.573

(58) Field of Classification Search
USPC .......................................... 257/288; 438/287
See application file for complete search history.

(56) References Cited

U.S. PATENT DOCUMENTS

| 5,021,857 | A | * | 6/1991 | Suehiro | 257/392 |
| 5,670,801 | A | * | 9/1997 | Nakano | 257/198 |
| 6,387,783 | B1 | * | 5/2002 | Furukawa et al. | 438/574 |
| 6,483,135 | B1 | * | 11/2002 | Mizuta et al. | 257/283 |
| 6,489,215 | B2 | * | 12/2002 | Mouli et al. | 438/400 |
| 6,593,603 | B1 | * | 7/2003 | Kim et al. | 257/194 |
| 6,627,473 | B1 | * | 9/2003 | Oikawa et al. | 438/46 |
| 7,244,973 | B2 | * | 7/2007 | Taniguchi et al. | 257/194 |
| 7,387,955 | B2 | * | 6/2008 | Ahn et al. | 438/574 |
| 7,432,563 | B2 | * | 10/2008 | Behammer | 257/401 |
| 7,445,975 | B2 | * | 11/2008 | Behammer | 438/182 |
| 7,573,081 | B2 | * | 8/2009 | Chan et al. | 257/276 |
| 7,622,767 | B2 | * | 11/2009 | Nogami et al. | 257/317 |
| 7,902,572 | B2 | * | 3/2011 | Ahn et al. | 257/194 |
| 7,910,955 | B2 | * | 3/2011 | Endoh et al. | 257/194 |
| 2002/0163036 | A1 | * | 11/2002 | Miura et al. | 257/336 |
| 2004/0016972 | A1 | * | 1/2004 | Singh et al. | 257/367 |
| 2004/0082158 | A1 | * | 4/2004 | Whelan et al. | 438/606 |
| 2004/0140506 | A1 | * | 7/2004 | Singh et al. | 257/367 |
| 2005/0023643 | A1 | * | 2/2005 | Li et al. | 257/565 |
| 2005/0098094 | A1 | * | 5/2005 | Oh et al. | 117/95 |
| 2005/0127398 | A1 | * | 6/2005 | Taniguchi et al. | 257/192 |
| 2006/0118823 | A1 | * | 6/2006 | Parikh et al. | 257/194 |
| 2006/0121658 | A1 | * | 6/2006 | Ahn et al. | 438/167 |

(Continued)

FOREIGN PATENT DOCUMENTS

| JP | 10-125696 A | 5/1998 |
| JP | 3226806 | 8/2001 |

(Continued)

*Primary Examiner* — Cheung Lee
*Assistant Examiner* — William Harriston
(74) *Attorney, Agent, or Firm* — Rabin & Berdo, P.C.

(57) ABSTRACT

Provided is a semiconductor device. The semiconductor device includes: a substrate; an active layer on the substrate; a capping layer on the active layer; source/drain electrodes on the capping layer; a gate electrode on the active layer; and a first void region on a first sidewall of the gate electrode and a second void region on a second sidewall facing the first sidewall.

18 Claims, 4 Drawing Sheets

(56) References Cited

U.S. PATENT DOCUMENTS

| | | | |
|---|---|---|---|
| 2006/0223245 A9* | 10/2006 | Pellens et al. | 438/167 |
| 2007/0099368 A1* | 5/2007 | Ahn et al. | 438/199 |
| 2008/0087916 A1* | 4/2008 | Amasuga et al. | 257/194 |
| 2008/0124852 A1* | 5/2008 | Ahn et al. | 438/182 |
| 2008/0251858 A1* | 10/2008 | Ahn et al. | 257/386 |
| 2009/0146184 A1* | 6/2009 | Lim et al. | 257/192 |
| 2011/0201164 A1* | 8/2011 | Chung et al. | 438/229 |

FOREIGN PATENT DOCUMENTS

| | | |
|---|---|---|
| KR | 10-0276077 B1 | 9/2000 |
| KR | 10-0331018 | 3/2002 |
| KR | 10-0631051 | 9/2006 |

* cited by examiner

SEMICONDUCTOR DEVICES AND METHODS OF FORMING THEREOF

CROSS-REFERENCE TO RELATED APPLICATIONS

This U.S. non-provisional patent application claims priority under 35 U.S.C. §119 of Korean Patent Application No. 10-2009-0083600, filed on Sep. 4, 2009, the entire contents of which are hereby incorporated by reference.

BACKGROUND OF THE INVENTION

The present invention disclosed herein relates to a semiconductor device and a method of forming thereof.

Semiconductor devices included in electronic products such as home appliances are important components that determine qualities of the electronic products. With the trend of the electronic products of large capacity storages, multi-functions and/or compactness, a demand on a semiconductor device with improved reliability and characteristic has been increased. To satisfy this demand, various techniques for improving the semiconductor devices are being introduced. As a method of improving characteristics of the semiconductor devices, patterns constituting the semiconductor devices have been continuously diversified and miniaturized. Especially, since the pattern miniaturization has manufacturing limitations, researches on the semiconductor devices with new patterns to improve their characteristics are actively in progress.

SUMMARY OF THE INVENTION

The present invention provides a semiconductor device with a high reliability.

The present invention also provides a semiconductor device with a reduced source resistance.

The present invention also provides a semiconductor device with an improved breakdown characteristic.

The present invention also provides a semiconductor device with a reduced parasitic capacitance.

Embodiments of the present invention provide semiconductor devices include: a substrate; an active layer on the substrate; a capping layer on the active layer; source/drain electrodes on the capping layer; a gate electrode on the active layer; and a first void region on a first sidewall of the gate electrode and a second void region on a second sidewall facing the first sidewall.

In some embodiments, the first void region and the second void region may have different forms.

In other embodiments, the semiconductor devices may further include a first insulation layer on the capping layer, wherein the first void region includes a first void upper region on the first insulation layer and a first void lower region below the first insulation layer.

In still other embodiments, the gate electrode may include a gate foot contacting the active layer and a gate head on the gate foot and a width of the gate head is broader than a width of the gate foot.

In even other embodiments, the semiconductor devices may further include: a second insulation layer on the first insulation layer; and a third insulation layer spaced apart from the first insulation layer, with the second insulation layer therebetween, wherein the second insulation layer has an etch selectivity with respect to the first and third insulation layers.

In yet other embodiments, the gate head may be disposed on the third insulation layer.

In further embodiments, the gate foot may be spaced apart from the second insulation layer and the capping layer.

In still further embodiments, the first void lower region may be defined by a space between a first sidewall of the gate foot and the capping layer and a space between the first insulation layer and the active layer.

In even further embodiments, the first void upper region may be defined by a space between the first sidewall of the gate foot and the second insulation layer and a space between the first insulation layer and the third insulation layer.

In yet further embodiments, the second void region may be disposed on a second sidewall of the gate foot and is defined by a space between the third insulation layer and the active layer.

In yet further embodiments, a distance between the gate foot and the source electrode may be shorter than that between the gate foot and the drain electrode.

In yet further embodiments, a distance between the first sidewall of the gate foot and the capping layer may be shorter than that between the second sidewall of the gate foot and the capping layer.

In other embodiments of the present invention, methods of forming a semiconductor device include: preparing a substrate; sequentially forming an active layer and a capping layer on the substrate; forming source/drain electrodes on the capping layer; forming a first insulation layer on the source/drain electrodes; exposing the capping layer by etching a portion of the first insulation layer; sequentially forming a second and a third insulation layers on the capping layer and the first insulation layer; forming an opening exposing a portion of the second insulation layer by etching a portion of the third insulation layer; forming a first recess exposing the capping layer by etching the second insulation layer through the opening; forming a second recess exposing the active layer by etching the capping layer; and forming in the opening a gate electrode connected to the active layer.

In some embodiments, the second insulation layer may have an etch selectivity with respect to the first and third insulation layers.

In other embodiments, the etching of the portion of the third insulation layer may be performed using an anisotropic etching process.

In still other embodiments, the anisotropic etching process may use an etching recipe having a higher etching rate with respect to the third insulation layer than the second insulation layer.

In even other embodiments, the exposing of the capping layer by etching the second insulation layer through the opening may be performed using an isotropic etching process.

In yet other embodiments, the isotropic etching process may use an etching recipe having a higher etching rate with respect to the second insulation layer than the first and third insulation layers.

In further embodiments, a width of the first recess may be broader than that of the opening.

In still further embodiments, a width of the second recess may be broader than that of the opening.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
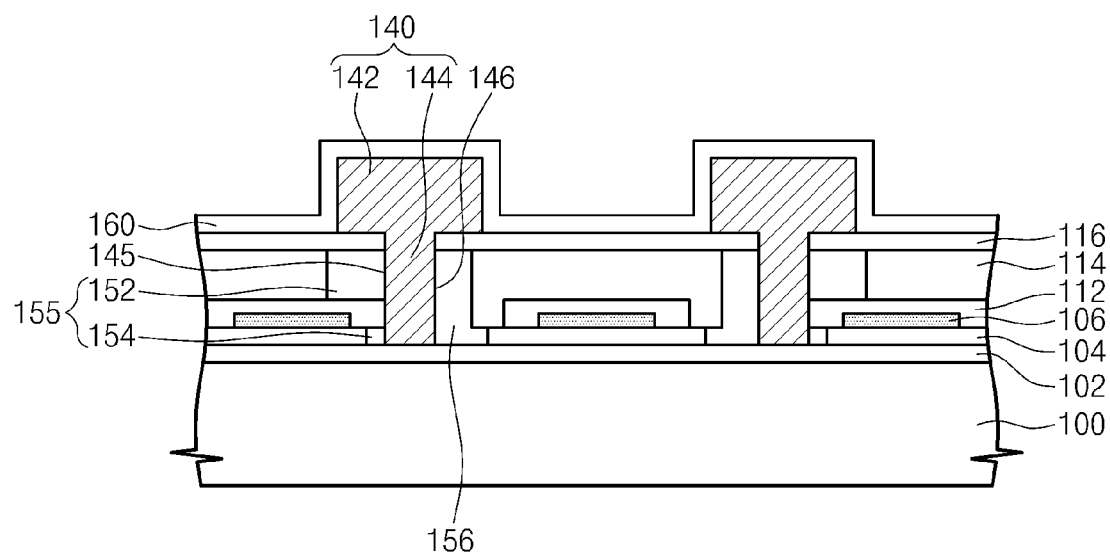
FIG. 1 is a sectional view illustrating a semiconductor device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

A semiconductor device according to an embodiment of the present invention will be described. FIG. 1 is a sectional view illustrating a semiconductor device according to an embodiment of the present invention.

Referring to FIG. 1, a substrate 100 is provided. The substrate 100 may be a semi-insulating compound semiconductor substrate. For example, the substrate 100 may include at least of GaAs, InP, InGaAs, InGaP, AlGaAs, GaN, or AlGaN, and also include other semiconductor substrates. An active layer 102 may be disposed on the substrate 100. The active layer 102 may include InGaAs or AlGaAs. A capping layer 104 may be disposed on the active layer 102. The capping layer 104 may be spaced from the substrate 100 with the active layer 102 interposed. The active layer 102 is interposed between the substrate 100 and the capping layer 104. The capping layer 104 may expose a portion of the active layer 102. A portion of the active layer 102 may not be covered with the capping layer 104. The capping layer 104 may include impurity-doped GaAs.

Although not illustrated in the drawings, a buffer layer (not shown) may be further interposed between the substrate 100 and the active layer 102. The buffer layer may serve to alleviate lattice mismatch between the substrate 100 and the active layer 102. The buffer layer may include at least of undoped GaAs, superlattice AlGaAs, or superlattice GaAs.

A source/drain electrodes 106 may be disposed on the capping layer 104. The source/drain electrodes 106 may contact the capping layer 104. The source/drain electrodes 106 may be ohmic-contact with the capping layer 104. In order to reduce ohmic contact resistance at the contact surface of the source/drain electrodes 106 and the capping layer 104, the capping layer 104 may include GaAs doped with impurity of a high concentration. The source/drain electrodes 106 may include at least of AuGe, Ni, or Au.

A first insulation layer 112 may be disposed on the source/drain electrode 106. The first insulation layer 112 may cover the source/drain electrodes 106. A portion of the first insulation layer 112 may expose a portion of the capping layer 104. A portion of the bottom surface of the first insulation layer 112 may face a portion of the top surface of the active layer exposed by the capping layer 104.

A second insulation layer 114 may be disposed on the first insulation layer 112. A portion of the second insulation layer 114 may expose a portion of the first insulation layer 112. The portion of the first insulation layer 112 may not be covered with the second insulation layer 114. The second insulation layer 114 may cover the capping layer 104 exposed by the first insulation layer 112. A portion of the bottom surface of the second insulation layer 114 may face a portion of the top surface of the active layer 102 exposed by the capping layer 104. The second insulation layer 114 may have an etch selectivity with respect to the first insulation layer 112.

A third insulation layer 116 may be disposed on the second insulation layer 114. A portion of the bottom surface of the third insulation layer 116 may face a portion of the top surface of the first insulation layer 112 exposed by the second insulation layer 114. The portion of the top surface of the first insulation layer 112 facing the bottom surface of the third insulation layer 116 may not be covered with the second insulation layer 114. A portion of the bottom surface of the third insulation layer 116 may face a portion of the top surface of the active layer 102 exposed by the capping layer 104. The portion of the top surface of the active layer 102 facing the bottom surface of the third insulation layer 116 may not be covered with the capping layer 104, the first insulation layer 112, and the second insulation layer 114. The third insulation layer 116 may include the same material as the first insulation layer 112. The third insulation layer 116 may have an etch selectivity with respect to the second insulation layer 114. For example, if the first and third insulation layers 112 and 116 include a silicon oxide, the second insulation layer 114 may include a silicon nitride. Unlike this, if the second insulation layer 114 includes a silicon oxide, the first and third insulation layers 112 and 116 may include a silicon nitride. The first, second, and third insulation layers 112, 114, and 116 may include a silicon oxide, a silicon nitride, porous silica gel, and other insulating materials.

A gate electrode 140 penetrating the third insulation layer 116 may be disposed on the active layer 102. The gate electrode 140 may contact the active layer 102. The gate electrode 140 may be a T-type gate electrode including a gate foot 144 and a gate head 142. The gate head 142 may be disposed on the third insulation layer 116. The gate foot 144 may contact the active layer 102. The width of the gate head 142 may be broader than that of the gate foot 144. The gate electrode 140 may include at least of Ti, Pt, or Au.

The gate electrode 140 may be spaced from the second insulation layer 114 and the capping layer 104. Void regions may be disposed between the both sidewalls of the gate electrode 140 and the second insulation layer 114, and between the both sidewalls of the gate electrode 140 and the capping layer 104.

In more detail, the gate foot 144 may include a first sidewall 145 and a second sidewall 146 facing the first sidewall 145. A first void region 155 and a second void region 156 may be disposed on the first sidewall 145 and the second sidewall 146, respectively. The first void region 155 and the second void region 156 may have different shapes. The distance between the first sidewall 145 of the gate foot 144 and the capping layer 104 may be different from that between the second sidewall 146 of the gate foot 144 and the capping layer 104. For example, the distance between the first sidewall 145 and the capping layer 104 may be shorter than that between the second sidewall 146 and the capping layer 104. The gate foot 144 may be more adjacent to one of the source/drain electrodes 106.

The first void region 155 may include a first void upper region 152 on the first insulation layer 112 and a first void lower region 154 below the first insulation layer 112. The first void lower region 154 may be defined by a space between the first sidewall 145 of the gate foot 144 and the capping layer 104 and a space between the first insulation layer 114 and the active layer 102. A portion of the top surface of the active layer 102 and a portion of the bottom surface of the first insulation layer 112 may face each other with the first void lower region 154 interposed.

The first void upper region 152 may be defined by a space between the first sidewall 145 of the gate foot 144 and the second insulation layer 114 and a space between the first insulation layer 112 and the third insulation layer 116. A portion of the top surface of the first insulation layer 112 and a portion of the bottom surface of the third insulation layer 116 may face each other with the first void upper region interposed. A portion of the first sidewall 145 of the gate foot 144 and the side of the second insulation layer 114 may face each other with the first void upper region 152 interposed.

The second void region 156 may be disposed on the second sidewall 146 of the gate foot 144. The second void region 156 may be defined by a space between the third insulation layer 116 and the active layer 102. With the second void region 156 interposed, a portion of the second sidewall 146 of the gate foot 144 may face the side of the capping layer 104 and the side of the second insulation layer 114. A portion of the bottom surface of the third insulation layer 116 and a portion of the top surface of the active layer 102 may face each other with the second void region 156 interposed.

Due to the first void upper region 152, parasitic capacitance between the gate electrode 140 and the source electrodes 116 may be reduced. Since the parasitic capacitance is reduced, the width of the gate electrode head 142 may be broader than an interval between adjacent the source/drain electrodes 106, such that resistance of the gate electrode 140 is reduced. As a result, a semiconductor device having excellent low noise characteristics can be provided.

The first void lower region 154 and the second void region 156 on the both sidewalls 145 and 146 of the gate foot 144 may be asymmetric, as mentioned above. Therefore, compared to symmetric voids on the both sidewalls 145 and 146 of the gate foot 144, a source resistance of a semiconductor device according to the present invention can be reduced and also break-down voltage characteristics can be improved.

Unlike the drawings, the first insulation layer 112 and the first sidewall 145 of the gate foot 144 may be spaced. In this case, the first void lower region 154 and the first void upper region 152 may be connected by a space between the side of the first insulation layer 112 and the first sidewall 145 of the gate foot 144. In this case, the first void lower region 154 and the first void upper region 152 may constitute a first void region of one body.

A fourth insulation layer 160 covering the gate electrode 140 may be disposed on the third insulation layer 116.

A method of forming a semiconductor device according to an embodiment of the present invention will be described. FIGS. 2A through 2G are sectional views illustrating a method of forming a semiconductor device according to an embodiment of the present invention.

Figure 2A:
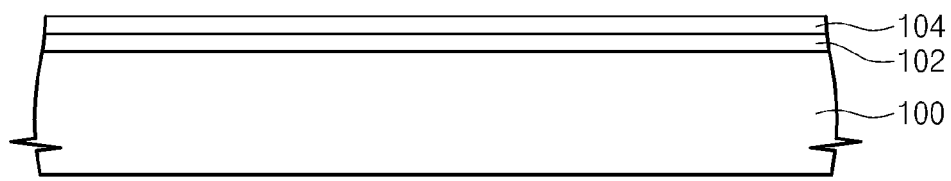
FIGS. 2A through 2G are sectional views illustrating a method of forming a semiconductor device according to an embodiment of the present invention.

Referring to FIG. 2A, a substrate 100 is provided. The substrate 100 may include other semiconductor materials or may be a semi-insulating compound semiconductor substrate. For example, the substrate 100 may include at least of GaAs, InP, InGaAs, InGaP, or AlGaN. An active layer 102 may be formed on the substrate 100. The active layer 102 may include at least of InGaAs or AlGaAs. A capping layer 104 may be disposed on the active layer 102. The capping layer 104 may include impurity-doped GaAs. Although not illustrated in the drawings, a buffer layer (not shown) may be further interposed between the substrate 100 and the active layer 102. The buffer layer may include at least of undoped GaAs, superlattice AlGaAs or superlattice GaAs.

Figure 2B:
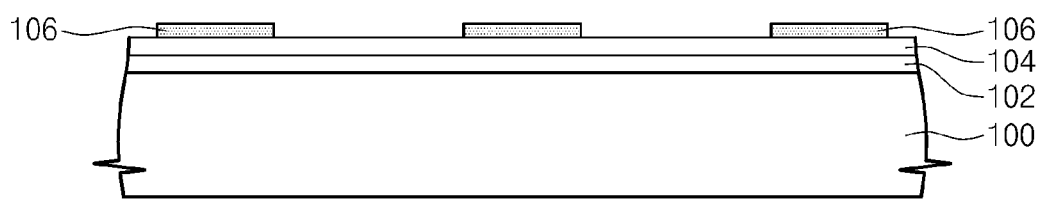

Referring to FIG. 2B, source/drain electrodes 106 may be formed on the capping layer 104. The source/drain electrodes 106 may be formed by defining with a photoresist pattern a region where the source/drain electrodes 106 are to be formed, forming a metal layer, and then performing a thermal treatment. For example, after AuGe, Ni, and Au are sequentially stacked on the capping layer 104 and a rapid thermal annealing process is performed thereon, the source/drain electrodes 106 may be formed. The source/drain electrodes 106 may be ohmic-contacted with the capping layer 104.

Figure 2C:
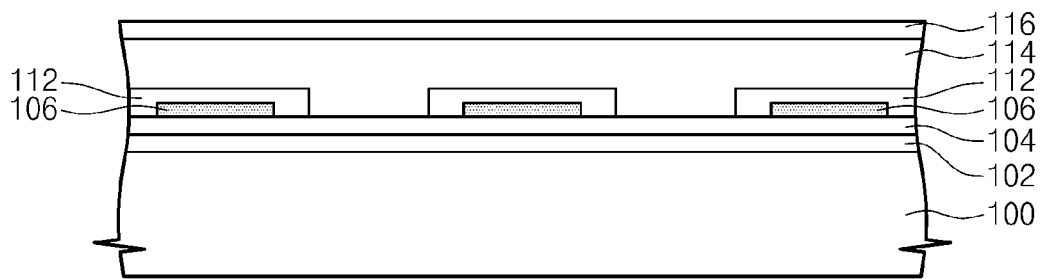

Referring to FIG. 2C, a first insulation layer 112 covering the source/drain electrodes 106 may be formed on the capping layer 104. The first insulation layer 112 may cover the capping layer 104. The first insulation layer 112 is patterned to expose a portion of the capping layer 104. A second insulation layer 114 and a third insulation layer 116 may be sequentially formed on the first insulation layer 112.

The first, second, and third insulation layers 112, 114, and 116 may include a silicon oxide, a silicon nitride, porous silica gel, and other insulating materials. The first insulation layer 112 and the third insulation layer 116 may have an etch selectivity with respect to the second insulation layer 114. The first insulation layer 112 and the third insulation layer 116 may include the same material. For example, if the first insulation layer 112 and the third insulation layer 116 include a silicon oxide, the second insulation layer 114 may include a silicon nitride. Unlike this, if the second insulation layer 114 includes a silicon oxide, the first and third insulation layers 112 and 116 may include a silicon nitride.

Figure 2D:
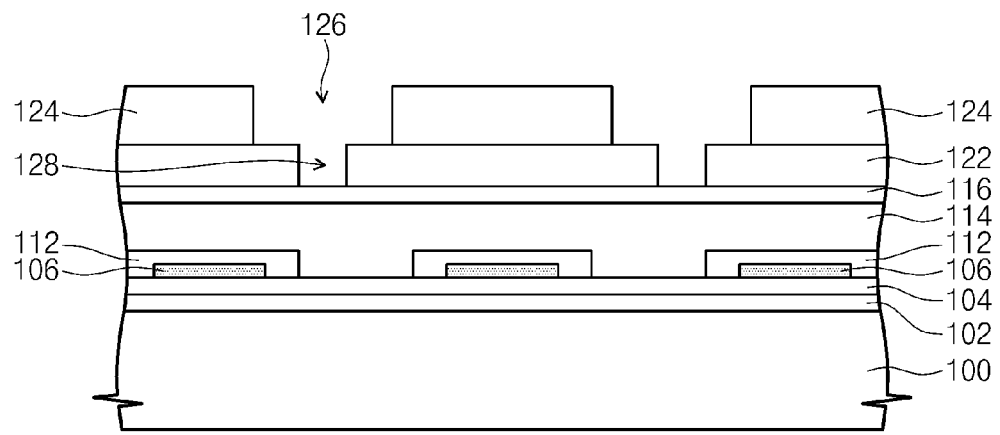

Referring to FIG. 2D, a first mask layer 122 and a second mask layer 124 may be sequentially formed on the third insulation layer 116. The first mask layer 122 and the second mask layer 124 may include a photoresist layer. The first mask layer 122 and the second mask layer 124 may have an etch selectivity with respect to the third insulation layer 116. By patterning the second mask layer 124, a first opening 126 exposing the first mask layer 122 may be formed. By patterning the first mask layer 122 exposed by the first opening 126, a second opening 128 exposing the third insulation layer 116 may be formed. The width of the first opening 126 may be broader than the width of the second opening 128. For example, an electron beam lithography process may be used for patterning the first and second mask layers 122 and 124. In this case, the first and second mask layers 122 and 124 may use a sensitive film combination of various layers such as PMMA/Copolymer/PMMA or ZEP/PMGI/ZEP.

Figure 2E:
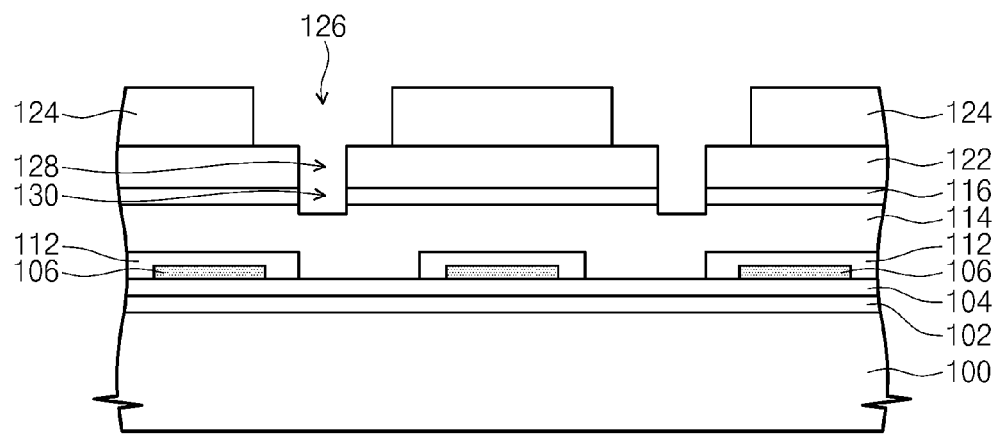

Referring to FIG. 2E, a portion of the third insulation layer 116 exposed by the second opening 128 may be etched. Since a portion of the third insulation layer 116 is etched, a third opening 130 exposing a portion of the second insulation layer 114 may be formed. The width of the third opening 130 may be about the same as that of the second opening 128. While the third insulation layer 116 is etched, a portion of the second insulation layer 114 may be etched.

The third insulation layer 116 may be etched by using an anisotropic etching process. The anisotropic etching process may be a dry etching process. For example, the anisotropic etching process may be performed using reactive ion etching (RIE), magnetically enhanced reactive ion etching (MERIE), or inductively coupled plasma (ICP). The anisotropic etching process may use an etching recipe in which an etch rate with respect to the third insulation layer 116 is higher than that with respect to the first mask layer 122, the second mask layer 124, and the second insulation layer 114.

Figure 2F:
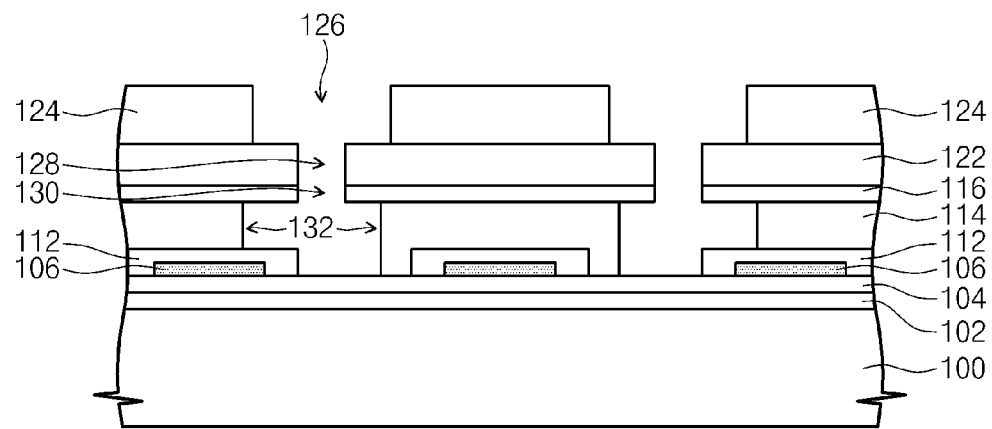

Referring to FIG. 2F, a portion of the second insulation layer 114 may be etched through the third opening 130. Since the portion of the second insulation layer 114 is etched, a first recess 132 exposing a portion of the capping layer 104 may be formed. The first recess 132 may expose a portion of the top surface of the first insulation layer 112 and a portion of the bottom surface of the third insulation layer 116. The width of the first recess 132 may be broader than those of the second opening 128 and the third opening 130. The width of the first recess 132 may be adjusted according to an etching degree of the second insulation layer 114. For example, as the second insulation layer 114 is etched, the width of the first recess 132 may broaden.

The second insulation layer 114 may be etched by using an isotropic etching process. The isotropic etching process may be a wet etching process. The isotropic etching process may be performed using an etching recipe having a higher etch rate with respect to the second insulation layer 114 than the first and the third insulation layers 112 and 116.

Figure 2G:
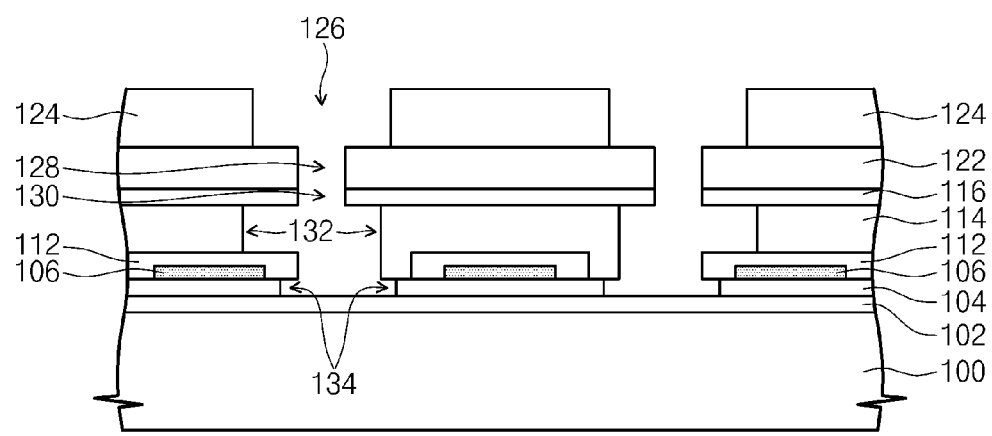

Referring to FIG. 2G, a portion of the capping layer 104 may be etched. Because of the etching of the capping layer 104, a second recess 134 exposing a portion of the active layer 102 may be formed. The second recess 134 may expose a portion of the bottom surface of the first insulation layer 112. The width of the second recess 134 may be broader than those of the second opening 128 and the third opening 130. The width of the second recess 134 may be adjusted according to an etching degree of the capping layer 104. For example, the as the capping layer 104 is etched, the width of the second recess 134 may broaden.

The etching of the capping layer 104 may be performed using a wet or dry etching process. Or, a combination of the wet and dry etching processes may be used. For example, the etching of the capping layer 104 may include a dry etching process using $BCl_3$ and $SF_6$ gas in electron cyclotron resonance (ECR) and inductive coupled plasma (ICP) equipment and a wet etching process using a mixed phosphate solution of $H_3PO_4$, $H_2O_2$, and $H_2O$.

Referring to FIGS. 1 and 2G, a gate electrode 140 connected to the active layer 102 may be formed in the third opening 130. The gate electrode 140 may be formed right after recess regions 132 and 134 are formed by etching the insulation layers 112, 114, and 116 and the capping layer 104. For example, the gate electrode 140 may be formed by forming a gate electrode layer including at least of Ti, Pt, or Au on the substrate 100 and performing a lift-off operation thereon. The gate electrode 140 may include a gate foot 144 connected to the active layer 102 and a gate head 142 on the third insulation layer 116. The width of the gate head 142 may be the same as that of the first opening 126. The gate foot 144 may fill the third opening 130. The gate foot 144 may be formed in the first and second recesses 132 and 134. The first and second recesses 132 and 134 may be separated by the gate foot 144.

Since the gate foot 144 separates the first and second recesses 132 and 134, a first void region 155 and a second void region 156 may be formed. The first void region 155 and the second void region 156 may be portions of the first recess 132 and the second recess 134. The first void region 155 may be formed on the first sidewall 145 of the gate foot 144. The second void region 156 may be formed on the second sidewall 146 of the gate foot 144 facing the first sidewall 145. The first void region 155 may include a first void upper region 152 on the first insulation layer 112 and a first void lower region 154 below the first insulation layer 112. Due to the first void upper region 152, parasitic capacitance between the gate electrode 140 and the source electrodes 116 is reduced such that a semiconductor device having an excellent low noise characteristic can be provided. The first void lower region 154 and the second void region 156 disposed on the both sidewalls 145 and 146 of the gate foot 144 may be asymmetric. Due to this, a source resistance of the semiconductor device can be reduced and break-down voltage characteristic can be improved.

After the forming of the gate electrode 140, a fourth insulation layer 160 may be formed on the substrate 100. The fourth insulation layer 160 may cover the gate electrode 140 and the third insulation layer 116. The fourth insulation layer 160 may be a silicon oxide layer or a silicon nitride layer.

According to the present invention, after the forming of the first and second recess regions 132 and 134, the gate electrode 140 may be formed without additional processes. Due to this, compared to removing the mask layers 122 and 124 and performing a additional patterning process (for example, a lithography process) to form a gate electrode, oxidation or damage of the surface of the active layer 102 can be prevented after a recess process, and processes can be simplified. Therefore, a method of a semiconductor device, which is optimized for process simplification, can be provided.

A semiconductor device according to the present invention includes void regions at both sidewalls of a gate electrode and has reduced source resistance, improved breakdown characteristic, and reduced parasitic capacitance. Therefore, a highly reliable semiconductor device can be provided. Also, a semiconductor device having an asymmetric recess structure can be manufactured right after a recess process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
    a substrate;
    an active layer on the substrate;
    a capping layer on the active layer;
    source/drain electrodes on the capping layer;
    a gate electrode on the active layer;
    a first void region on a first sidewall of the gate electrode and a second void region on a second sidewall facing the first sidewall;
    a first insulation layer on the capping layer, a second insulation layer on the first insulation layer; and
    a third insulation layer spaced apart from the first insulation layer, with the second insulation layer therebetween,
    wherein the first void region includes a first void upper region on the first insulation layer and a first void lower region below the first insulation layer,
    wherein the gate electrode comprises a gate foot contacting the active layer and a gate head on the gate foot, and a width of the gate head is broader than a width of the gate foot, wherein the second insulation layer has an etch selectivity with respect to the first and third insulation layers, and wherein the second void region is defined by a space between the third insulation layer and the active layer, the second void region extends from the active layer to the third insulation layer without discontinuity, and the second void region has an upper end in contact with the third insulation layer and a lower end in contact with the active layer.

2. The semiconductor device of claim 1, wherein the first void region and the second void region have different forms.

3. The semiconductor device of claim 1, wherein the gate head is disposed on the third insulation layer.

4. The semiconductor device of claim 1, wherein the gate foot is spaced apart from the second insulation layer and the capping layer.

5. The semiconductor device of claim 1, wherein the first void lower region is defined by a space between a first sidewall of the gate foot and the capping layer and a space between the first insulation layer and the active layer.

6. The semiconductor device of claim 5, wherein the first void upper region is defined by a space between the first sidewall of the gate foot and the second insulation layer and a space between the first insulation layer and the third insulation layer.

7. The semiconductor device of claim 6, wherein the second void region is disposed on a second sidewall of the gate foot and is defined by a space between the third insulation layer and the active layer.

8. The semiconductor device of claim 7, wherein the source/drain electrodes include a source electrode and a drain electrode, and a distance between the gate foot and the source electrode is shorter than that between the gate foot and the drain electrode.

9. The semiconductor device of claim 8, wherein a distance between the first sidewall of the gate foot and the capping layer is shorter than that between the second sidewall of the gate foot and the capping layer.

10. A method of forming a semiconductor device, the method comprising:
preparing a substrate;
sequentially forming an active layer and a capping layer on the substrate;
forming source/drain electrodes on the capping layer;
forming a first insulation layer on the source/drain electrodes;
exposing the capping layer by etching a portion of the first insulation layer;
sequentially forming a second and a third insulation layers on the capping layer and the first insulation layer;
forming an opening exposing a portion of the second insulation layer by etching a portion of the third insulation layer;
forming a first recess exposing the capping layer by etching the second insulation layer through the opening;
forming a second recess exposing the active layer by etching the capping layer; and
forming in the opening a gate electrode connected to the active layer, wherein a void region is defined by a space between the third insulation layer and the active layer, the second void region extends from the active layer to the third insulation layer without discontinuity, and the void region has an upper end in contact with the third insulation layer and a lower end in contact with the active layer.

11. The method of claim 10, wherein the second insulation layer has an etch selectivity with respect to the first and third insulation layers.

12. The method of claim 11, wherein the etching of the portion of the third insulation layer is performed using an anisotropic etching process.

13. The method of claim 10, wherein a width of the first recess is broader than that of the opening.

14. The method of claim 10, wherein a width of the second recess is broader than that of the opening.

15. A method of forming a semiconductor device, the method comprising:
preparing a substrate;
sequentially forming an active layer and a capping layer on the substrate;
forming source/drain electrodes on the capping layer;
forming a first insulation layer on the source/drain electrodes;
exposing the capping layer by etching a portion of the first insulation layer;
sequentially forming a second and a third insulation layers on the capping layer and the first insulation layer;
forming an opening exposing a portion of the second insulation layer by etching a portion of the third insulation layer;
forming a first recess exposing the capping layer by etching the second insulation layer through the opening;
forming a second recess exposing the active layer by etching the capping layer; and
forming in the opening a gate electrode connected to the active layer,
wherein the second insulation layer has an etch selectivity with respect to the first and third insulation layers,
wherein the etching of the portion of the third insulation layer is performed using an anisotropic etching process, and
wherein the anisotropic etching process uses an etching recipe having a higher etching rate with respect to the third insulation layer than the second insulation layer.

16. A method of forming a semiconductor device, the method comprising:
preparing a substrate;
sequentially forming an active layer and a capping layer on the substrate;
forming source/drain electrodes on the capping layer;
forming a first insulation layer on the source/drain electrodes;
exposing the capping layer by etching a portion of the first insulation layer;
sequentially forming a second and a third insulation layers on the capping layer and the first insulation layer;
forming an opening exposing a portion of the second insulation layer by etching a portion of the third insulation layer;
forming a first recess exposing the capping layer by etching the second insulation layer through the opening;
forming a second recess exposing the active layer by etching the capping layer; and
forming in the opening a gate electrode connected to the active layer,
wherein the second insulation layer has an etch selectivity with respect to the first and third insulation layers, and
wherein the exposing of the capping layer by etching the second insulation layer through the opening is performed using an isotropic etching process.

17. The method of claim 16, wherein the isotropic etching process uses an etching recipe having a higher etching rate with respect to the second insulation layer than the first and third insulation layers.

18. A semiconductor device comprising:
a substrate;
an active layer on the substrate;
a capping layer on the active layer;
source/drain electrodes on the capping layer;
a gate electrode on the active layer;
a first void region on a first sidewall of the gate electrode and a second void region on a second sidewall facing the first sidewall;
a first insulation layer on the capping layer,
a second insulation layer on the first insulation layer; and
a third insulation layer spaced apart from the first insulation layer, with the second insulation layer therebetween,
wherein the second void region is defined by a space between the third insulation layer and the active layer, the second void region extends from the active layer to the third insulation layer without discontinuity, and the second void region has an upper end in contact with the third insulation layer and a lower end in contact with the active layer.

* * * * *